United States Patent [19]
Harris et al.

[11] 4,009,400
[45] Feb. 22, 1977

[54] DIGITALLY CONTROLLED VARIABLE CONDUCTANCE

[75] Inventors: Richard Wayne Harris, Stockton; Harry Thomas Lee, Sunnyvale, both of Calif.

[73] Assignee: Lockheed Missiles & Space Company, Inc., Sunnyvale, Calif.

[22] Filed: Nov. 28, 1975

[21] Appl. No.: 636,106

[52] U.S. Cl. .......................... 307/233 A; 307/229; 307/251; 307/304; 328/167; 330/85; 330/107
[51] Int. Cl.² .................. H03K 9/06; H03K 17/60
[58] Field of Search ............. 307/233 A, 229, 251, 307/304, 233 R; 328/167

[56] References Cited

UNITED STATES PATENTS

| 3,588,531 | 6/1971 | Bjor | 307/229 |
| 3,767,939 | 10/1973 | Chamran | 307/251 |
| 3,860,877 | 1/1975 | Games et al. | 328/167 |

*Primary Examiner*—John S. Heyman
*Attorney, Agent, or Firm*—H. Donald Volk; Billy G. Corber

[57] ABSTRACT

A digitally tuned active filter is disclosed. The filter is tunable by digitally controlling the variable conductance which comprises two resistors, one of which is in series with a field-effect transistor switch and those two in parallel with the other resistor. The field-effect transistor switch is switched by a digitally controlled variable duty cycle generator.

5 Claims, 3 Drawing Figures

DIGITALLY CONTROLLED VARIABLE CONDUCTANCE

BACKGROUND OF THE INVENTION

This invention is in the field of active filter networks, particularly networks which can be tuned from one predetermined center frequency to another over a range of adjustable possible center frequencies. Such networks are useful, for example, in signal processing systems.

Circuits using operational amplifiers to synthesize bandpass filters have been known for some time. Such a circuit is described in the paper titled "The Biquad: Part I — Some Practical Design Considerations," Lee C. Thomas, Transactions on Circuit Theory, May 1971, Volume CT-18, of Institute of Electrical and Electronics Engineers.

Circuits using operational amplifiers to synthesize active filter networks having a variable center frequency have also been known for some time. Typical examples are shown in U.S. Pat. Nos. 3,731,218, 3,755,749 and 3,803,429. The primary disadvantage of the circuits of the prior art is that they are only switchable from one predetermined center frequency to a second or plurality of predetermined center frequencies. The prior methods of switching allow circuit transients to be introduced into the filter due to the multiplicity of switches required at each node or the existence of momentary open circuit states.

The prior art active filter networks are switched by a number of switching circuits but none show an active filter network where the center frequency can be controlled by a single common control. As a result, it has not been possible to obtain stable switch tunable bandpass filters in the active filter networks of the prior art.

SUMMARY OF THE INVENTION

This invention overcomes the disadvantages of the prior art variable active filter networks. This circuit of the invention provides excellent tuning linearity over a range that can be accurately controlled by means of digital tuning. Also, the quality factor or Q and the gain A of the filter are independent of the frequency tuning of the filter.

A preferred embodiment of the variable active filter network of the invention requires three operational amplifiers. The first amplifier has two input terminals and one output terminal, the positive input terminal being resistively coupled to the input terminal of the filter network. The positive input terminal is also connected to the output terminal of the third operational amplifier via a fixed resistance. The negative input terminal of the first operational amplifier is connected to the output terminal of the second operational amplifier via a fixed resistance. The negative input terminal and the output terminal of the first operational amplifier are connected through a resistor. The output terminal of the first operational amplifier is also connected, via a second variable conductance, to the negative input terminal of the third operational amplifier.

The output terminal of the second operational amplifier is capacitively coupled to the negative input terminal of the second operational amplifier. The positive input terminal of the second operational amplifier is connected to ground. The positive input terminal of the third operational amplifier is also connected to ground. The output terminal of the third operational amplifier is capacitively coupled to the negative input terminal of the third operational amplifier and connected via the first variable conductance to the negative input terminal of the second operational amplifier. The output terminal of the third operational amplifier is also connected to the negative input of the first operational amplifier via a fixed resistance and to the output terminal of the filter network.

Each of the first and second variable conductances consists of a first resistor in parallel with the combination of a field-effect transistor and a second resistor. The state of the field-effect transistor is controlled by a digitally controlled variable duty cycle generator that is connected to the base of the field-effect transistor via a resistor.

The variable duty cycle generator includes a first and a second counter, a reference oscillator and an output flip-flop. A control word producing means is connected to the variable duty cycle generator.

DESCRIPTION OF THE PREFERRED EMBODIMENT

Figure 1:
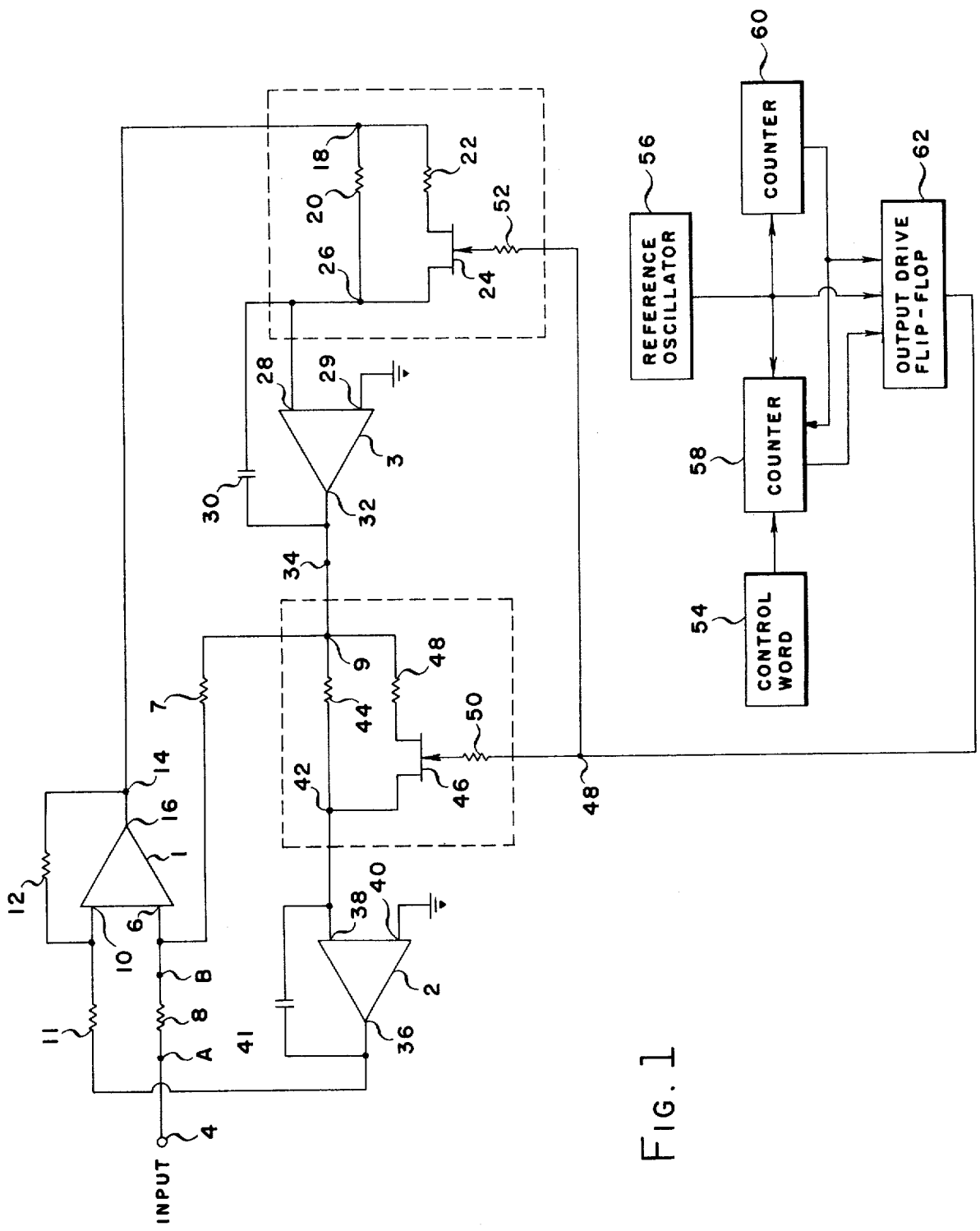
FIG. 1 is a block and schematic diagram of a preferred embodiment of the active filter of the invention.

Referring to FIG. 1, the circuit of the preferred embodiment of the invention includes three operational amplifiers: amplifier 1, amplifier 2 and amplifier 3.

In operation, the input is applied at terminal 4. Input terminal 6 of the amplifier 1 is connected through resistance 8 to input terminal 4. Input terminal 6 is also resistively coupled through resistor 7 to terminal 9. Input terminal 10 of amplifier 1 is resistively coupled through feedback resistor 12 to the output terminal 14.

Amplifier 1 and feedback resistors 7, 11 and 12 and input resistor 8 form a summation network. Terminal 14, in turn, is connected to output terminal 16 of amplifier 1 and to terminal 18. Resistors 20 and 22 also are connected to terminal 18. The terminal of resistor 22 not connected to terminal 18 is connected to field-effect transistor 24. The field-effect transistor 24 is also connected as shown to terminal 26. The terminal of resistor 20 not connected to terminal 18 is also connected to terminal 26. Terminal 26, in turn, is connected to input terminal 28 of amplifier 3. Input terminal 28 is also capacitively coupled through feedback capacitor 30 to the output terminal 32 of amplifier 3 and directly to terminal 9 and output terminal 34. Input terminal 29 is connected to ground. Amplifier 3 and the first digitally controllable variable conductance and feedback capacitor 30 form a first integrator.

The input terminal 10 of amplifier 1 is also resistively coupled by resistor 11 to the output terminal 36 of amplifier 2. Input terminal 38 of amplifier 2 is also capacitively coupled through capacitor 41 to the output terminal 36 of amplifier 2. Input terminal 40 of amplifier 2 is connected to ground. Amplifier 2 and the second digitally controllable variable conductance and feedback capacitor 41 form a second integrator.

Input terminal 38 of amplifier 2 is also connected to terminal 42. Resistor 44 is connected from terminal 42 to terminal 9. Field-effect transistor 46 and resistor 48 are connected in series between terminal 42 and terminal 9, as shown. The base of field-effect transistor 46 is resistively connected to terminal 48 by resistor 50.

The base of field-effect transistor 24 is resistively connected to terminal 48 by resistor 52. Field-effect transistor 24 and resistors 20, 22 and 52 form a first digitally controllable variable conductance. Similarly, field-effect transistor 46 and resistors 44, 48 and 50 also form a second digitally controllable variable conductance.

The conductance of the two digitally controllable variable conductances is controlled by a variable duty cycle generator consisting of a control word source 54, a reference oscillator 56, counter 58, counter 60 and output drive flip-flop 62.

In operation counter 60 generates a switch drive "on" signal every T seconds. This on signal sets the flip-flop 62 to a conducting state, which, in turn, switches the field-effect transistors to the conducting state which changes the conductance of the variable conductances to the maximum value. Simultaneously, the switch drive on signal from counter 60 triggers the counter 58 to load the digital control word from control word source 54. The counter 58 counts down to zero and then resets the flip-flop 62 to a non-conductive state. This switches the field-effect transistors off which changes the conductance of the variable conductance to the minimum value. The field-effect transistors remain off the remainder of the T period and then the above sequence is repeated.

The field-effect transistors are switched at a high rate compared to the maximum frequency of the filter tuning range so that the filter output will be essentially unaffected by the switching transients. For example, the reference oscillator can be a 10 megahertz clock, the control word can be an 8-bit word that can range from 1 to 256 "ticks" of the clock, and the filter can be tunable from 960 Hertz to 9,770 Hertz. A simple fixed low-pass filter can be used to remove switching transients, if desired.

Figure 2:
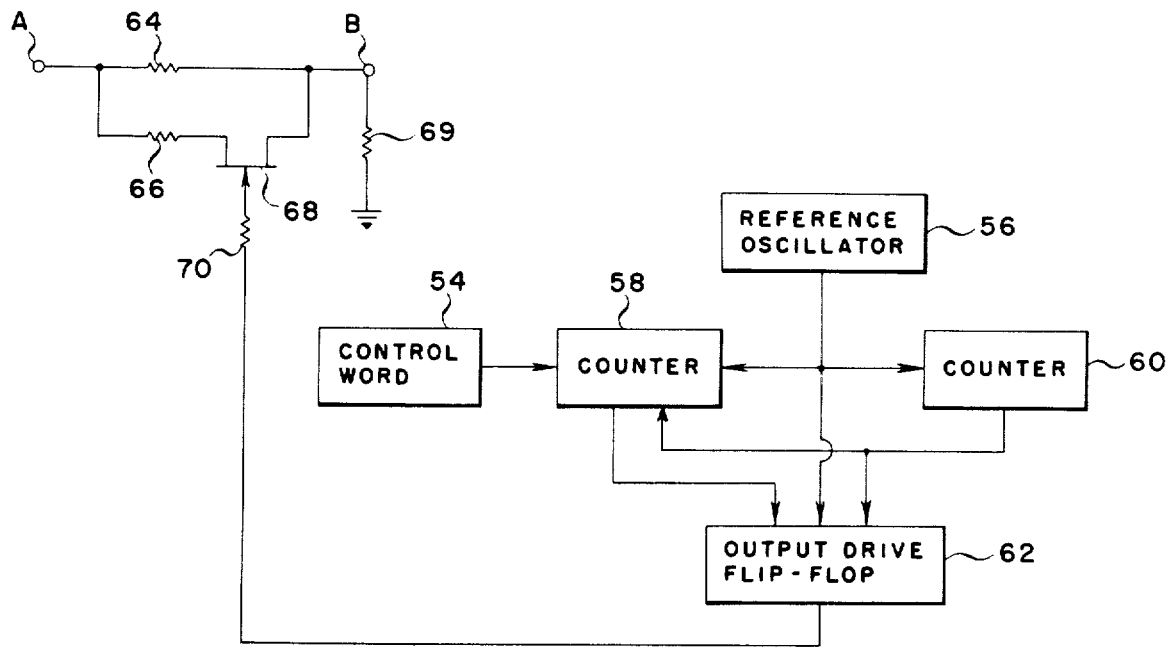
FIG. 2 is a block and schematic diagram of an exemplary modification of the embodiment of FIG. 1.

FIG. 2 shows a circuit for varying the magnitude of the output of the filter at terminal 34. The circuit shown in FIG. 2 can be connected between terminals A and B of FIG. 1 instead of the resistor 8.

As shown in FIG. 2, resistor 64 is connected between terminals A and B. Resistor 66 and field-effect transistor 68 are connected in series with each other between terminal A and B as shown. Resistor 69 is connected between terminal B and ground. The base of field-effect transistor 68 is resistively connected to flip-flop 62 of a variable duty cycle generator by resistor 70. The variable duty cycle generator is similar to the variable duty cycle generator shown in FIG. 1 so the same reference numbers have been used. The variable duty cycle generator consists of a control word source 54, a reference oscillator 56, counter 58, and counter 60 and output drive flip-flop 62.

Figure 3:
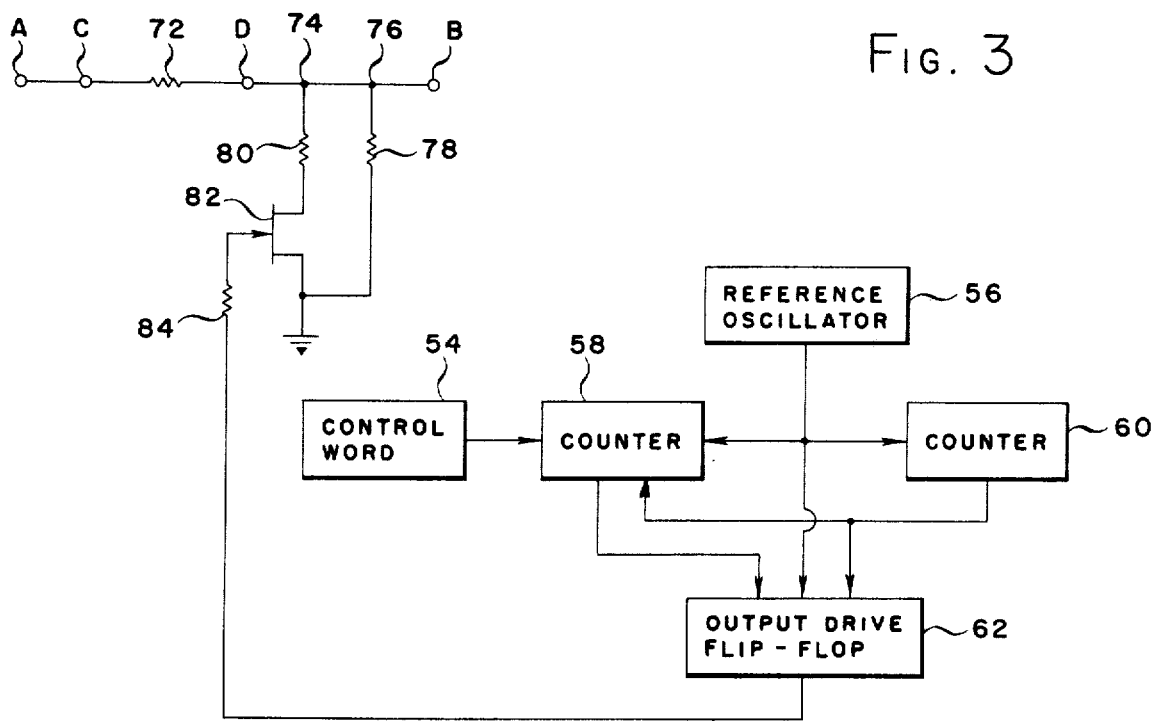
FIG. 3 is a block and schematic diagram of an exemplary modification of the embodiment of FIG. 1.

FIG. 3 shows another variation on the circuit of FIG. 1 that is usable to vary the Q of the filter. Terminal C is connected to terminal A. Resistor 72 is connected between terminals C and D. Terminals 74 and 76 are connected between terminal D and terminal B. Resistor 78 is connected between terminal 76 and ground. Resistor 80 and field-effect transistor 82 are connected in series between terminal 74 and ground. The base of field-effect transistor 82 is resistively connected to flip-flop 62 by resistor 84.

Flip-flop 62, in combination with control word source 54, reference oscillator 56, counter 58 and counter 60 form a variable duty cycle generator similar to the variable duty cycle generator shown in FIG. 1 so the same reference numbers have been used.

If it is desired to vary the Q of the filter as well as the magnitude of the output of the filter, the circuit shown in FIG. 2, with resistor 69 deleted, can be substituted between terminals C and D for fixed resistor 72 in FIG. 3.

Other modifications and advantageous applications of this invention will become to those having ordinary skill in the art. Therefore, it is intended that the matter contained in the foregoing description and the accompanying drawings be intepreted as illustrative and not limitative, the scope of the invention being defined by the appended claims.

What is claimed:

1. The digitally controlled variable conductance comprising:
a first resistance means connected between said first and second terminal;
a second resistance means and a switching means, said second resistance means and said switching means connected in series and connected between said first and second terminal;
said switching means further defined as including a control terminal;
digital means operatively connected to said control terminal to control the conductance of said variable conductance;
said digital means includes a means for receiving a control word, a reference oscillator, a first counter, a second counter, and an output drive flip-flop;
said reference oscillator connected to said first and second counters to provide a reference timing;
said second counter generating an on signal that sets the said flip-flop to a conductive state and triggers said first counter to load the control word, whereby said switching means is turned on when said flip-flop is in the conductive state and is turned off when the first counter counts down to zero.

2. The digitally controlled variable conductance according to claim 1 wherein said switching means is a field-effect transistor switch and a third resistance means is connected between said digital means and said field-effect transistor switch.

3. A tunable active filter controlled by the digitally variable conductance of claim 2, said tunable active filter includes a first amplifier means having a positive input terminal, the input terminal of said active filter connected to the positive terminal of the first amplifier means by a first resistive means, the said positive terminal of said first amplifier means is also operatively connected to the output terminal of a third amplifier, the negative terminal of said first amplifier is resistively coupled to the output of said first amplifier, the said negative terminal of said first amplifier is also operatively connected to the output terminal of a second amplifier, the output of said first amplifier is operatively connected to the negative input of said third amplifier by a first digitally controlled variable conductance means, the output of said third amplifier is operatively connected to the negative input of said second amplifier by a second digitally controlled variable conductance means, said second and third amplifier outputs conductively coupled to their respective input terminals whereby the center frequency of said active filter is controlled by the first and second digitally controlled variable conductances.

4. The tunable active filter of claim 3 wherein said first resistive means is a third digitally controlled conductance and further defined as including a fourth resistance means connected between said first amplifier positive input terminal and ground whereby the magnitude of the output of the filter can be controlled.

5. The tunable active filter of claim 3 including a fourth digitally controlled conductance connected between said positive terminal of said first amplifier and ground whereby the Q of the filter can be adjusted.

* * * * *